United States Patent [19]
Tezuka et al.

[11] Patent Number: 5,999,181
[45] Date of Patent: *Dec. 7, 1999

[54] NETWORK DEVELOPMENT SUPPORT SYSTEM

[75] Inventors: Satoru Tezuka; Shigeru Miyake; Hiroshi Furukawa, all of Yokohama; Kenichi Kihara, Fujisawa; Chiho Kitahara, Kawasaki; Hideomi Idei, Yokohama; Shihoko Taguchi, Kawasaki; Hikari Namba, Yokohama, all of Japan; Alberto Suzano, Sao Paulo-sp, Brazil

[73] Assignee: Hitachi, Ltd., Tokyo, Japan

[ * ] Notice: This patent is subject to a terminal disclaimer.

[21] Appl. No.: 08/833,252

[22] Filed: Apr. 4, 1997

Related U.S. Application Data

[63] Continuation of application No. 08/531,902, Sep. 21, 1995, Pat. No. 5,619,640.

[30] Foreign Application Priority Data

Sep. 22, 1994 [JP] Japan .................................. 6-228230

[51] Int. Cl.$^6$ ...................................................... G06F 11/00
[52] U.S. Cl. ........................................... 345/356; 345/354
[58] Field of Search ..................................... 395/356, 326, 395/137, 117; 345/354, 353, 352, 340, 339, 326–356, 137

[56] References Cited

U.S. PATENT DOCUMENTS

| | | | |
|---|---|---|---|
| 5,019,961 | 5/1991 | Addessi et al. | 395/160 |
| 5,295,230 | 3/1994 | Kung | 395/75 |
| 5,325,533 | 6/1994 | McInerny et al. | 395/700 |
| 5,432,932 | 7/1995 | Chen et al. | 395/161 |
| 5,471,560 | 11/1995 | Allard et al. | 395/77 |
| 5,475,843 | 12/1995 | Haluiatti et al. | 395/700 |
| 5,483,468 | 1/1996 | Chen et al. | 364/551 |
| 5,515,524 | 5/1996 | Lynch et al. | 345/500 |
| 5,519,866 | 5/1996 | Lawrence et al. | 395/700 |
| 5,528,735 | 6/1996 | Strasnick et al. | 395/127 |
| 5,619,690 | 4/1997 | Tezuka et al. | 345/356 |

FOREIGN PATENT DOCUMENTS 6-110663   4/1994   Japan .

*Primary Examiner*—Steven P. Sax
*Attorney, Agent, or Firm*—Antonelli, Terry, Stout & Kraus, LLP

[57] ABSTRACT

In a network development support system, it is supported that logical hierarchic structure, physical parameters, and logical parameters of a network are integrally designed in an environment in which relationships therebetween can be confirmed. Definition of logical hierarchic structure of the network is accepted in the form of a tree of containers in a container tree window. Physical and logical parameters are accepted in physical and logical object windows, respectively. The physical and logical object windows are created in association with containers of the container trees.

1 Claim, 15 Drawing Sheets

FIG. 8

|  |  | WINDOW |
|---|---|---|
| FILE | LOAD SAVE  EXPORT MERGE PRINT,ETC | CONTAINER TREE |
| EDIT | CUT COPY  POSTE,ETC | ALL |
| CREATE | CONTAINER USER,USER GROUP,VOLUME,ETC COMPUTER A,COMPUTER B, PRINTER,PERIPHERAL UNIT | CONTAINER TREE, LOGICAL OBJECT, PHYSICAL OBJECT |
| SETUP | USER,USER GROUP,VOLUME CLIENT,FILE SERVER,PRINTER PRINT SERVER | LOGICAL OBJECT, PHYSICAL OBJECT |
| OPTION |  |  |

NETWORK DEVELOPMENT SUPPORT SYSTEM

This is a continuation of application Ser. No. 08/531,902, filed Sep. 21, 1995, now U.S. Pat. No. 5,619,640.

BACKGROUND OF THE INVENTION

The present invention relates to a technology to support a network designer in a network developing job and, in particular, to a technology to help the network designer easily develop a large-scale network.

For a physical construction in which a plurality of information apparatuses are connected to each other via a transmission path to function as a network, it is necessary to set to each of the information apparatuses physical parameters such as a network address and a machine name.

Conventionally, the physical parameters are sequentially installed in each information apparatus via a keyboard or the like of the apparatus.

However, when deciding the physical parameters to be installed in each information apparatus, it is required to recognize the construction of the overall network so as to understand meaning of each physical parameter. Furthermore, in the installation of the physical parameters in each information apparatus, there is required professional knowledge related to operations of the information apparatuses. In consequence, conventionally, each information apparatus is required to be operated by, for example, an expert to install physical parameters therein. Therefore, such jobs as the construction of a large-scale network have been attended with difficulty.

According to a technology described in the JP-A-6-110663, the development of a system such as selection of physical parameters for each information apparatus is carried out in a single apparatus. Designed physical parameters are stored for each information apparatus on a media such as a floppy disk. Additionally, the floppy disk is mounted on each pertinent information apparatus to install the physical parameters therein. Moreover, according to this technology, since the design work is accomplished by use of graphical user interface (GUI) or the like, the system design efficiency is improved.

According to the technology, the system design work including the decision of parameters to initialize each information apparatus can be separated from the job of installing physical parameters in each information apparatus. In other words, the network design engineer need only determine physical parameters of each information apparatus via a single apparatus. The installation of the physical parameters in each information apparatus is effected only by loading the information apparatus with the physical parameters stored in a floppy disk or the like and hence there is not required any experienced knowledge. In consequence, the installation job may be entrusted to an operator other than the system engineer. For example, a system end user may achieve the installation.

Consequently, when compared with the prior art, the network system design and installation can be more easily conducted.

In this connection, to enable a network utilization independent of the physical configuration of the network, there has been recently achieved a job in which a logical hierarchic structure of the network is designed in association with the the physical configuration of the network such that parameters to implement operation of the network according to the logical hierarchic structure are set to each information apparatus.

Furthermore, in addition to the physical parameters described above, logical parameters represented by, for example, a user name of each information apparatus are also required for the information apparatuses in the network.

For the logical parameters and logical hierarchic structure, the design work is desirably separated from the installation job.

In this regard, the physical parameters, logical parameters, and logical hierarchic structure described above are mutually related to each other while keeping preset independence of each other. For example, the physical parameters are dependent on the physical structure of the network, and the physical parameters and logical hierarchic structure are required to be associated with the physical structure of the network to obtain an optimal utilization efficiency of the network. Additionally, depending on the logical hierarchic structure, the logical parameters such as a user of each information apparatus are possibly related to a certain hierarchic unit in the logical hierarchic structure.

In consequence, these items are required to be integrally designed in a development environment in which the mutual relationships between these items can be confirmed while retaining the preset independence.

In a large-scale network, it is difficult for the designer to precisely recognize the overall image of the network. Therefore, the design of physical parameters, logical parameters, and logical hierarchic structure is favorably accomplished by an expert versed in the physical configuration of the network.

Moreover, in a large-scale network, it is difficult to guarantee integrity between the parameters installed in each information apparatus and each logical hierarchic level.

SUMMARY OF THE INVENTION

It is therefore an object of the present invention to provide a network development support system capable of separating the design job of physical parameters, logical parameters, and logical hierarchic structure from the installation job of the designed parameters and logical hierarchic structure in the network.

It is another object of the present invention to provide a network development support system for supporting an integral design of at least two kinds of defining items selected from the physical parameters, logical parameters, and logical hierarchic logical structure in an environment in which mutual relationships can be confirmed between these two kinds of defining items can be confirmed while keeping preset dependence of each other.

It is still another object of the present invention to provide a network development support system for supporting the design of physical parameters, logical parameters, and logical hierarchic structure in which for each portion of the logical hierarchic structure, an expert versed in the design of each portion conducts the design in a shared fashion.

It is a further object of the present invention to provide a network development support system for supporting the guaranteeing of integrity of the various kinds of parameters specified for each information apparatus.

To achieve the object above according to the present invention, there is provided a network development support system for use with a network including information apparatuses in which physical parameters defining physical constitution of the respective information apparatuses, logical parameters defining logical constitution of the network, and logical hierarchic structure of the network are set to the respective information apparatuses. The system includes a design support unit including means for supporting design of the logical hierarchic structure of the network, means for supporting the setting of the physical parameters in relation to the logical hierarchy of the network thus designed, means for supporting design of the logical parameters in relation to the logical hierarchy of the network thus designed, and means for storing therein information indicating the designed physical parameters, logical parameters, and logical hierarchic structure, the information being stored as a parameter file. The system further includes an installing section disposed in each of the information apparatuses constituting the network, including means operative for each of the information apparatuses for extracting from the physical parameters, logical parameters, and logical hierarchic structure indicated by the information of the parameter file the contents to be set to the information apparatus, and means for setting the extracted contents to the information apparatus.

The design support apparatus of the network development support system of the present invention supports the design of physical parameters, logical parameters, and logical hierarchic structure and stores the designed information in the form of a parameter file. The installing section arranged in each information apparatus in the network accesses the physical parameters, logical parameters, and logical hierarchic structure in the parameter file stored by the design support apparatus to extract therefrom the contents to be set to the associated information apparatus and then sets the extracted contents to the information apparatus.

In consequence, the design of the physical parameters, logical parameters, and logical hierarchic structure can be separated from the actual setting thereof.

BRIEF DESCRIPTION OF THE DRAWINGS

FIG. 8 is a diagram showing a layout of the main menu of the design support apparatus according to the embodiment of the present invention.

DESCRIPTION OF THE PREFERRED EMBODIMENTS

Figure 1:
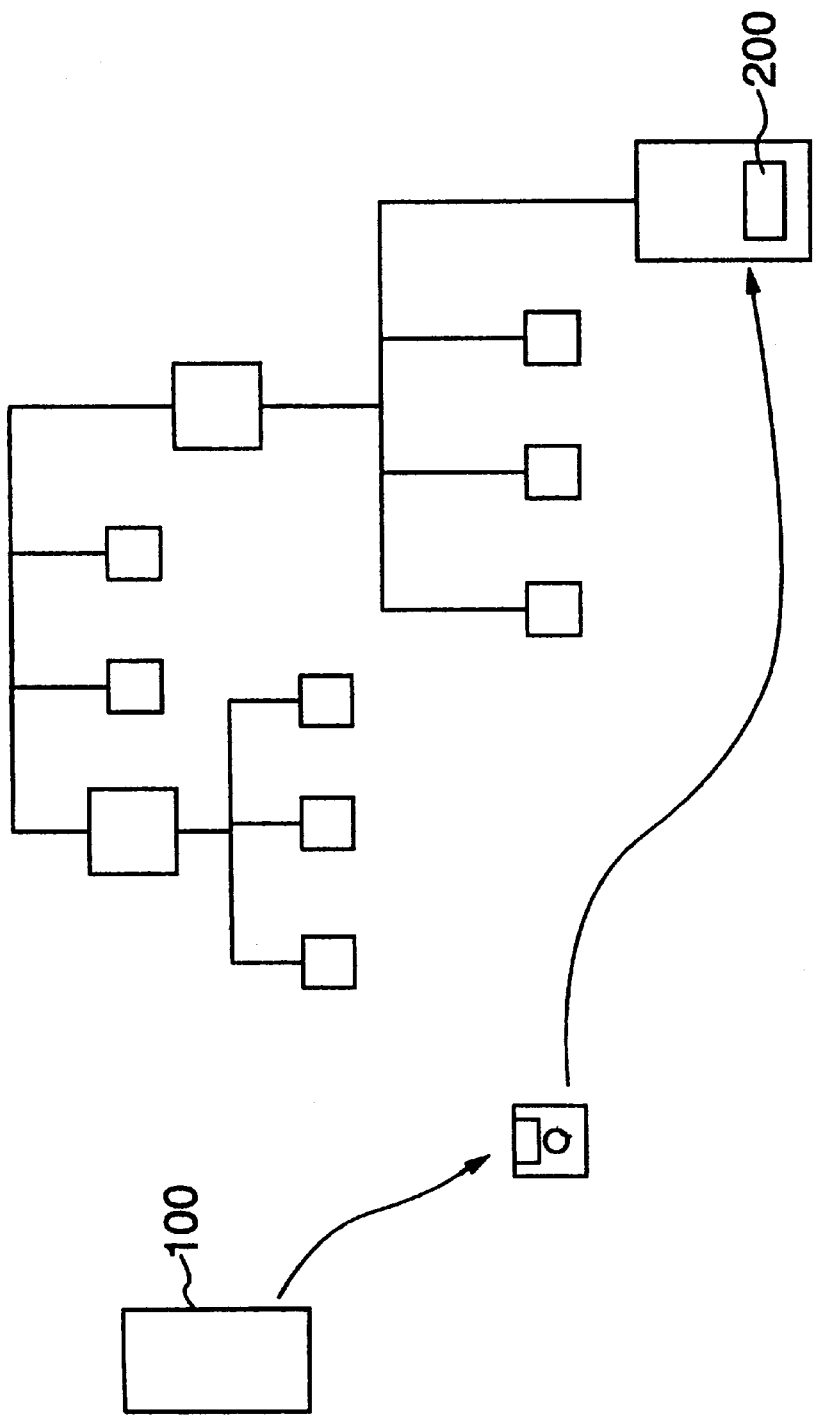
FIG. 1 is a block diagram showing the configuration of a network development support system according to an embodiment of the present invention.

FIG. 1 shows the structure of a network development support system according to an embodiment of the present invention.

As shown in the diagram, the network development support system includes a design support unit 100 for designing logical hierarchic structure, physical parameters, and logical parameters of a network and storing the designed contents on a transportable media such as a floppy disk and an automatic installing section 200 provided in each information apparatus in the network for reading the stored contents to be set thereto from the installed floppy disk and setting the contents thereto.

Figure 2:
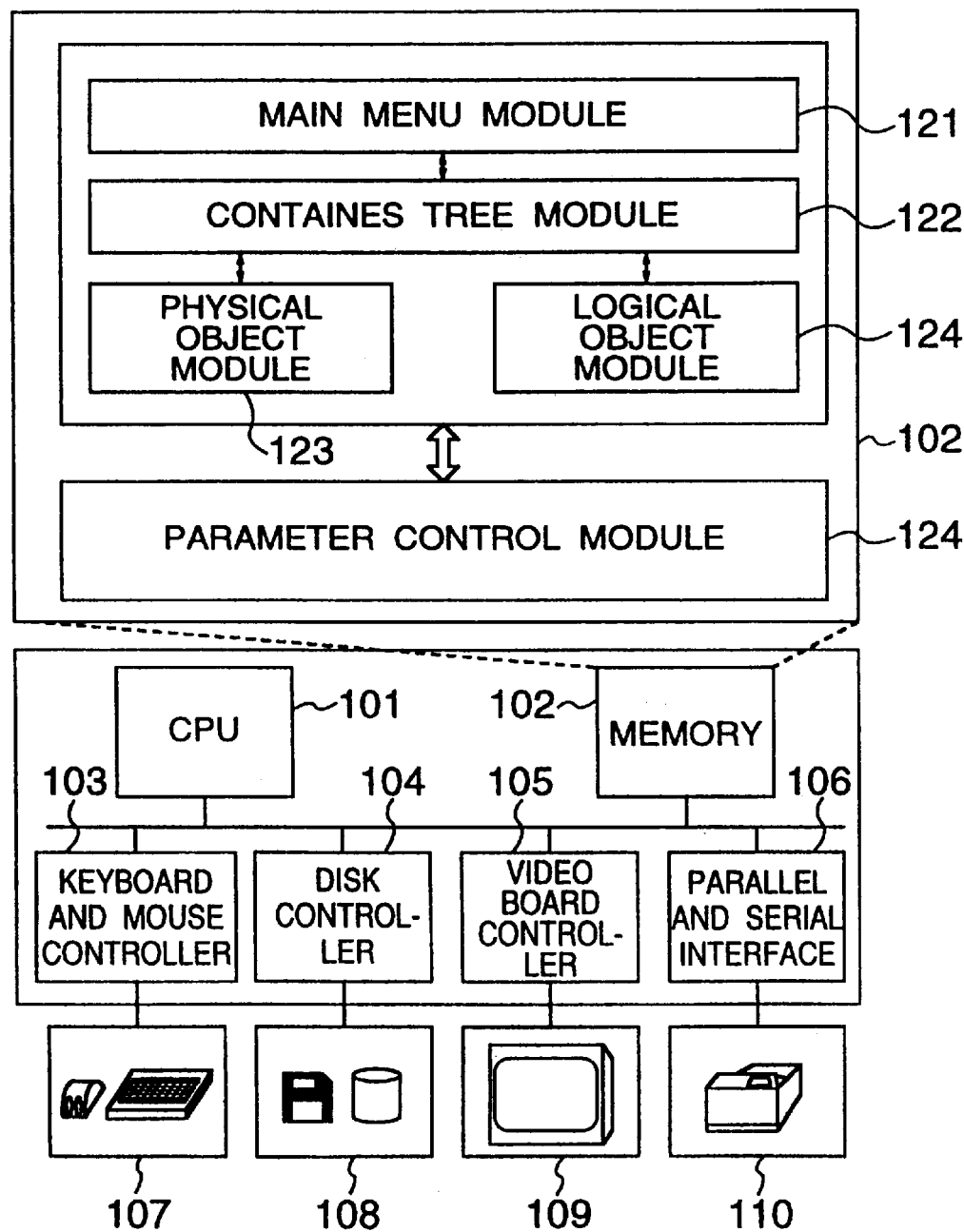
FIG. 2 is a block diagram showing the configuration of a design support system according to the embodiment of the present invention.

FIG. 2 shows constitution of the design support unit 100.

The design support unit 100 is an ordinary computer including external facilities including an input device 107 such as a keyboard or a mouse, an external storage 108 such as a floppy disk drive or a hard disk device, a display unit 109, and a printer 110; controllers 103 to 106 for controlling input and output operations of these external facilities, an interface circuit 105, a central processing unit (CPU), and a memory 102.

Stored in the memory 102 is a design support program 120 to be executed by the CPU 101. The design support program 120 includes such program modules as a main menu module 121, a container tree module 122, a physical object module 123, a logical object module 124, and a parameter control module 124.

Figure 3:
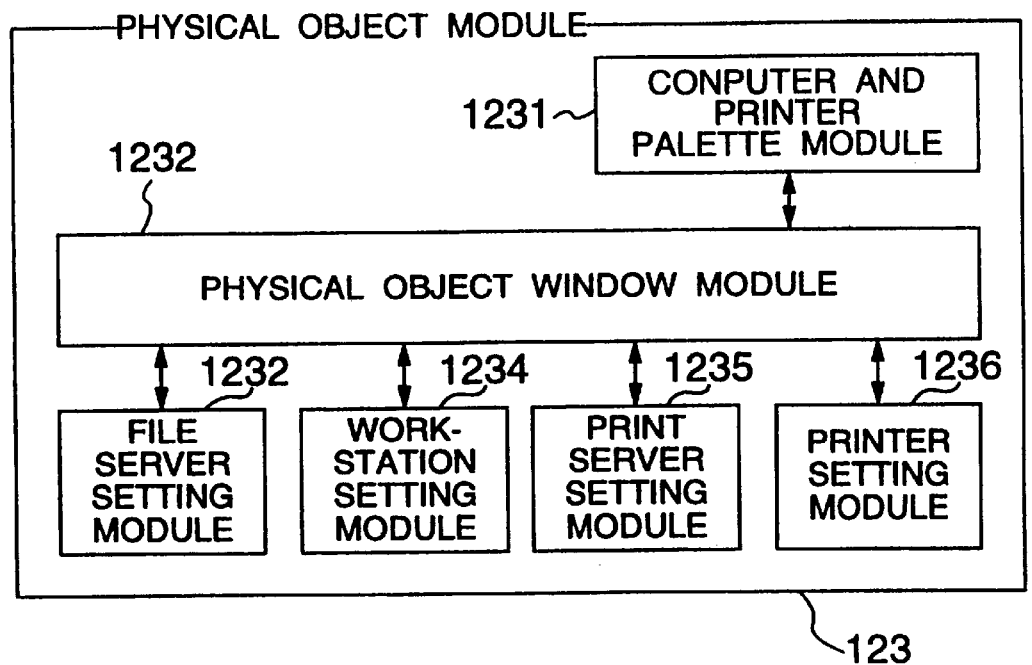
FIG. 3 is a block diagram showing the configuration of a physical object module according to the embodiment of the present invention.
Figure 4:
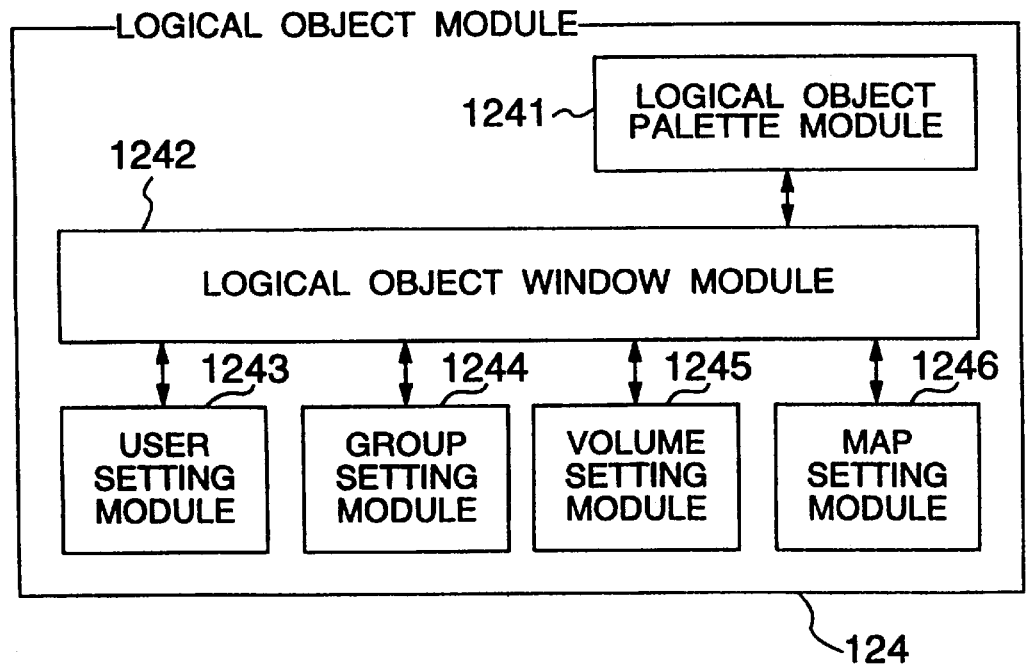
FIG. 4 is a block diagram showing the configuration of a logical object module according to the embodiment of the present invention.
Figure 5:
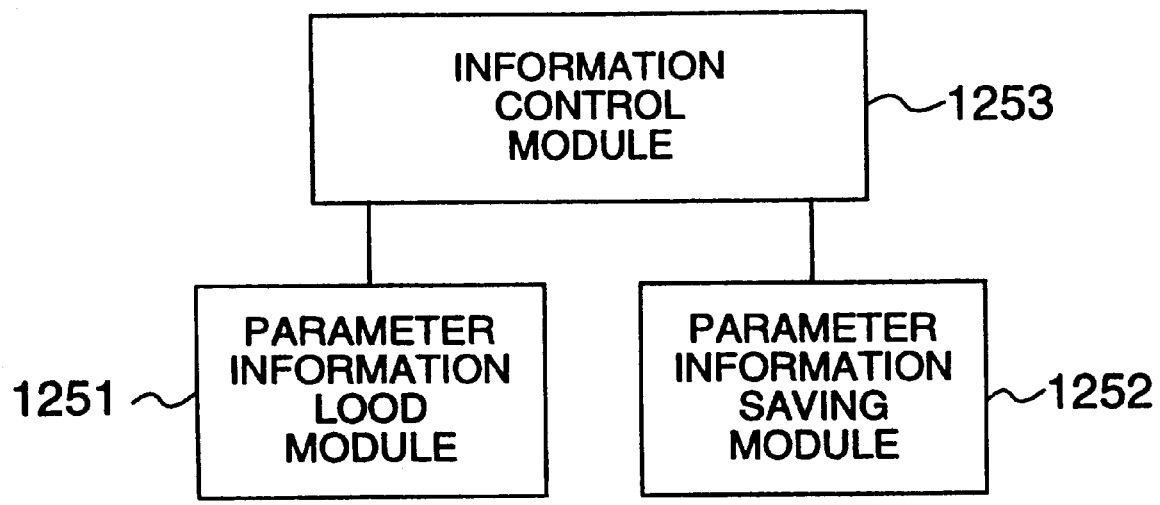
FIG. 5 is a block diagram showing the configuration of a parameter control module according to the embodiment of the present invention.

In addition, as shown in FIG. 3, the physical object module 123 includes a computer and printer palette module 1231, a physical object window module 1232, a file server setting module 1233, a workstation setting module 1234, a print server setting module 1235, and a printer setting module 1236. Furthermore, as shown in FIG. 4, the logical object module 124 includes a logical object palette module 1241, a logical object window module 1242, a user setting module 1243, a group setting module 1244, and a map setting module 1245. Additionally, as can be seen from FIG. 5, the parameter control module 125 includes an information control module 1253, a parameter information load module 1251, and a parameter information saving module 1252.

Individual processes respectively corresponding to these program modules are executed by the CPU 101. For convenience, each process will be called by the name of the associated program module in the following description.

Next, operation of the design support unit 100 will be described.

Description of the embodiment will be given of an example in which a network including a plurality of local area networks (LANs) connected via routers and gateways are used by a hierarchic organization. The hierarchic organization means, for example, an organization in which an upper hierarchic unit includes sets of lower-hierarchic units such as an enterprise including sections, departments, offices, operation divisions, and firms. In this case, it is assumed that one or more LANs are installed in each hierarchic unit, for example, in each section and there exists no LAN to be shared between a plurality of hierarchic units such as sections. In addition, each LAN is connected to information apparatuses including a file server, a workstation, a printer server, and a printer. In this description, it is assumed one or more LAN are installed in each section.

The logical hierarchic structure of the network, logical parameters, and physical parameters of the respective information apparatuses are designed by the design support unit 100.

Figure 6:
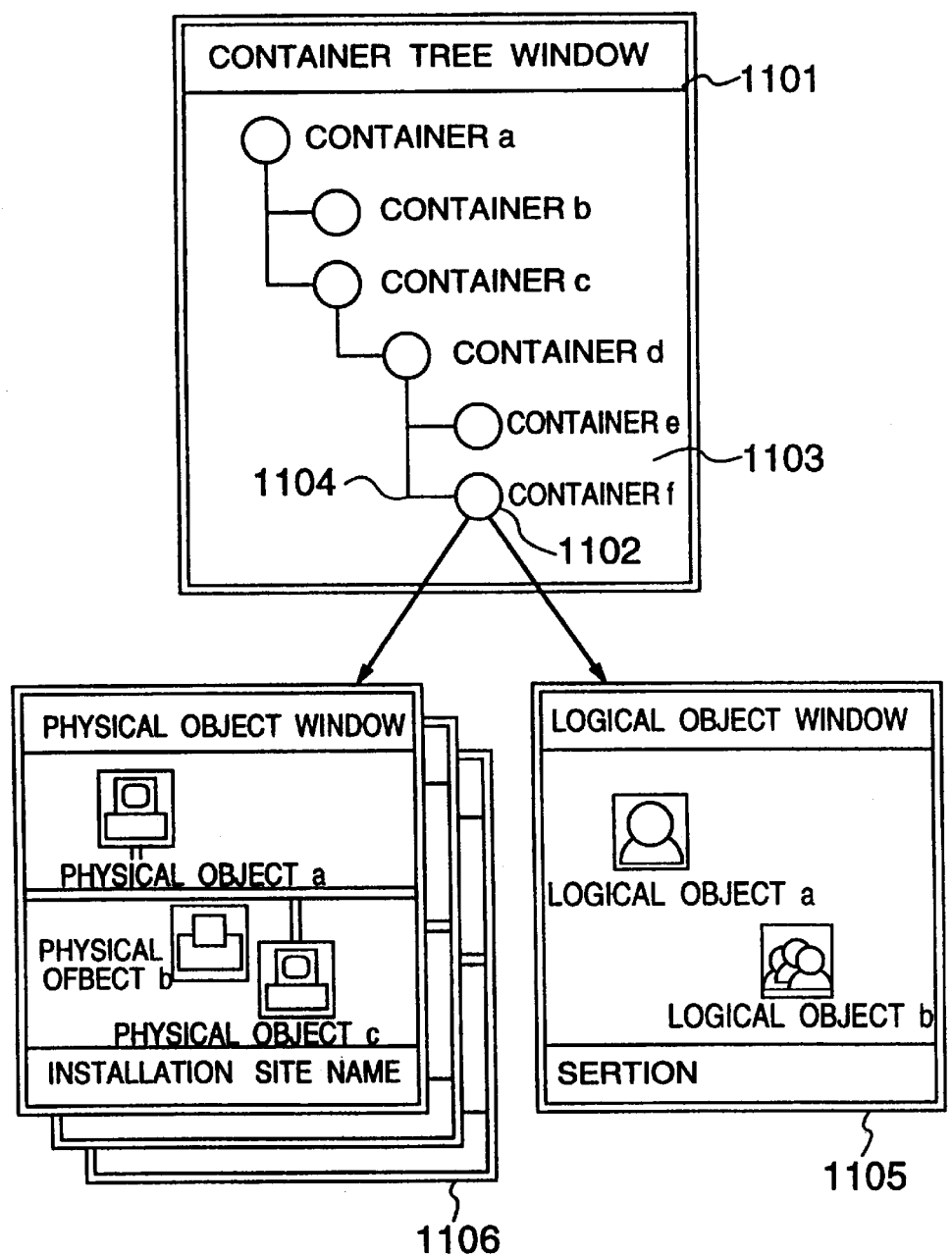
FIG. 6 is a diagram showing windows presented by a design support apparatus according to the embodiment of the present invention.
Figure 7:
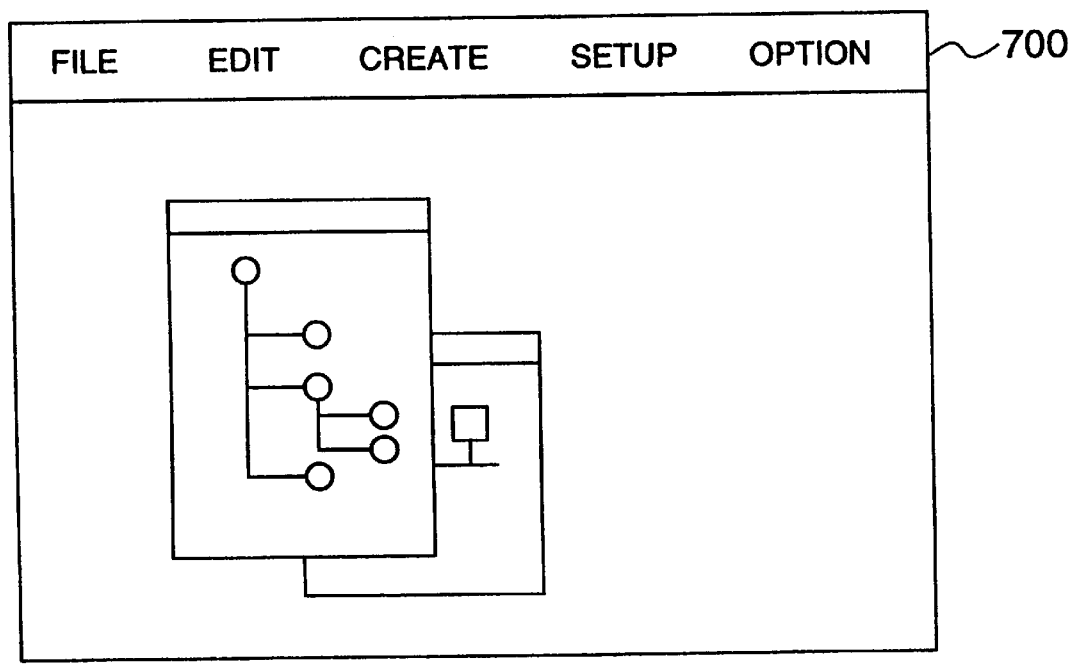
FIG. 7 is a diagram showing a main menu presented by the design support apparatus according to the embodiment of the present invention.

As shown in FIG. 6, the logical hierarchic structure is displayed in the form of a container tree 1103 in a container tree window on the display 109.

Each container indicates the unit of logical hierarchic structure, for example, one section or division. Moreover, a line 1104 connecting a container to another container designates existence of a relationship between the containers, that is, one of the containers is at a higher level and the other one is at a lower level. A container on the right-hand side of each line is a lower-level container. A root container occupies the upper-end position of the logical hierarchic structure of the network.

Physical parameters are presented in a physical object window 1106. One physical object window corresponds to one LAN. Shown in the example of FIG. 6 is the physical object window 1106 corresponding to a container f 1102 associated with a section. Since one or more LANs is or are assumed to be installed in each section, one or more physical object windows are created for the container corresponding to the section.

Similarly, physical parameters corresponding to the container f are displayed in a logical object window 1105.

When the design of the logical hierarchic structure, logical parameters, and physical parameters is completely achieved via windows, the designed information items are stored as parameter information in the external storage 108.

Various operations are carried out in the respective windows by use of the mouse 107 and the keyboard.

Operation of the design support unit 100 will be next described.

When the design support program 120 is invoked in the design support unit 100, the main menu module 121 executes a program initiating process.

In the program initiating process, a dialog to input necessity or unnecessariness of production of a root container is presented on the display 109. When an indication of whether or not the root container is to be produced is supplied from the input device 107, the displayed dialog is cleared. The result of the input operation is stored in a storage.

Subsequently, a main menu 700 is displayed and then the container tree window 1101 is created by the container tree module 122. As a result, the container tree window 1101 enters an active state, i.e., a state in which operations of the container tree window 1101 are enabled.

The main menu module 121 displays a main menu according to an indication from the program initiating module 125.

The activated container tree module 122 generates the container tree window 1101 and then creates a root container in the container tree window 1101 according to an indication of production thereof. In response to a focus move indication from the main menu module 121, the container tree module 122 moves the focus to the root container. That is, there is established a state in which the root container is specified.

Subsequently, description will be given of menus displayed in the main menu. The main menu module 121 ordinarily displays "file", "edit", "create", "setup", and "option" menus. When either one thereof is chosen by the mouse, a more detailed menu is displayed. However, the menu displayed is changed according to the window which is active at the point of the choosing operation. When a menu is specified, the main menu module 121 instructs a module which conducts a process related to the selected menu to execute the process and which restores the original state.

FIG. 8 shows the kinds of menus and windows selected when the respective menus are presented.

Next, description will be given of the design of logical hierarchic structure of a network through the container tree window 1101.

As already described, the logical hierarchic structure of a network is designed in the form of a tree of containers 1103. That is, when a designer draws a tree of containers 1103, the container tree module 122 generates data defining the logical hierarchic structure of a network according to the tree.

In this regard, description will be first given of a procedure in which the designer draws a tree of containers 1103.

The designer specifies by a mouse a container as a father for containers to be created and then denotes by the mouse a container of "create" in the container main menu, the pertinent condition is notified to the container tree module 122 by the main menu module 12. Having received the notification, the container tree module 122 displays icons of the container in the container tree window 1101. When a label area is specified for the displayed container and then a text is inputted via the keyboard, the text is presented as a title of the container.

And then, the container tree module 122 displays a new container on the right side and below the father container previously specified and automatically draws a line between the new container and the father container. Additionally, in this operation, to provide a space for the presentation of containers, the display positions of the respective containers presented in location below the father container are automatically shifted downward. In this manner, the designer sequentially adds containers from the upper level to the lower level to thereby completely create a tree of containers.

Furthermore, the designer can move, delete, and copy created containers. The move of a container is accomplished through "drag" and "drop" operations of the container by the mouse or by a combination of "cut" and "paste" in "edit" of the main menu. The deletion of a container is effected, for example, by specifying a container by the mouse and by designating "cut" menu in "edit" of the main menu. The copy of a container is carried out by a combination of "copy" and "paste" in "edit" of the main menu.

Figure 9:
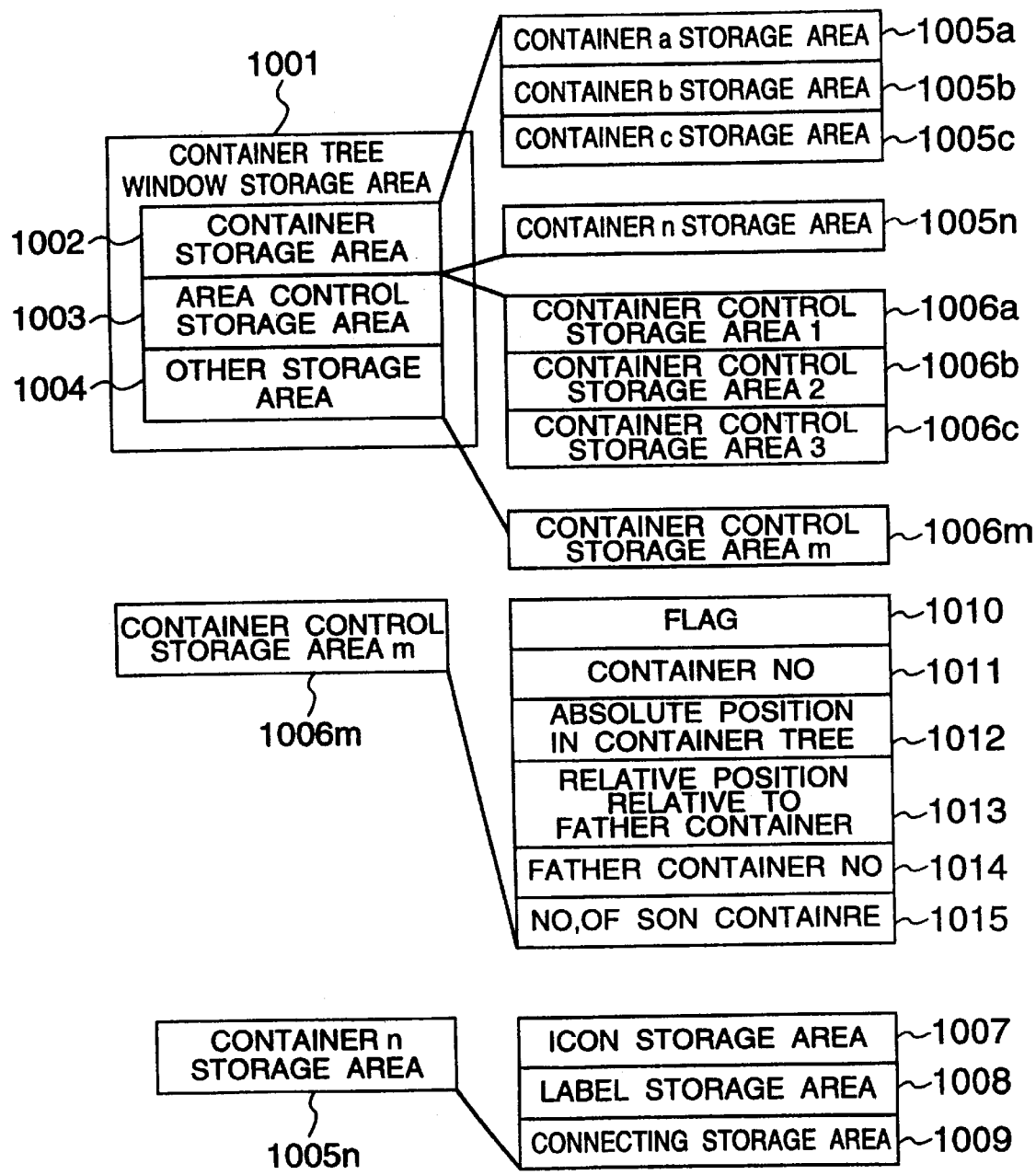
FIG. 9 is a diagram showing a layout of container tree window storage areas according to the embodiment of the present invention.

Incidentally, the container tree above is expressed by the container tree module 122 as information shown in FIG. 9 in a container tree window storage area 1001 provided in the memory 102. The edit of the container tree described above is actually conducted by the container tree module 122 through edit of the information according to the operation of the designer and display of data and correction of displayed data according to the information.

In other words, as shown in FIG. 9a, the network logical hierarchic structure represented by a container tree is defined by information stored in a container storage area 1002, an area control storage area 1003, and the like. The container storage area 1002 is a set of container x control storage areas 1005a, 1005b, ..., 1005n for storing therein container display information, whereas the area control storage area 1003 is a set of container control storage areas x 1006a, 1006b, ..., 1006m for storing positional information or the like of containers in the logical hierarchy expressed by the container tree.

Moreover, as shown in FIG. 9b, each of the container x control storage areas 1005a, 1005b, ..., 1005n includes an icon storage area 1007 in which information specifying a contour and display position coordinates of an icon of the associated container is to be described, a label storage area in which a title and display position coordinates of the associated container are described, and a connecting line storage area in which display position coordinates or the like of a line connecting the corresponding container to the father container thereof are described.

Additionally, as shown in FIG. 9c, each container control storage area x (1006a, 1006b, ..., 1006m) includes a use flag 1010 indicating whether or not the pertinent container is in use, a container number 1011 of the controlled container, an absolute position in container tree 1012, a relative position relative to father container 1013, a number of father container 1014 of the corresponding container, the number of son containers 1015 of the corresponding container, and the like. The absolute position in container tree 1012 indicates the sequence number of the pertinent container in the container tree relative to the upper-most container of the tree, whereas the relative position relative to father container 1013 designates the sequence number of the container relative to the father container in the tree.

Incidentally, description will be next given of the setting of physical parameters via physical object windows and the setting of logical parameters via logical object windows.

Figure 10:
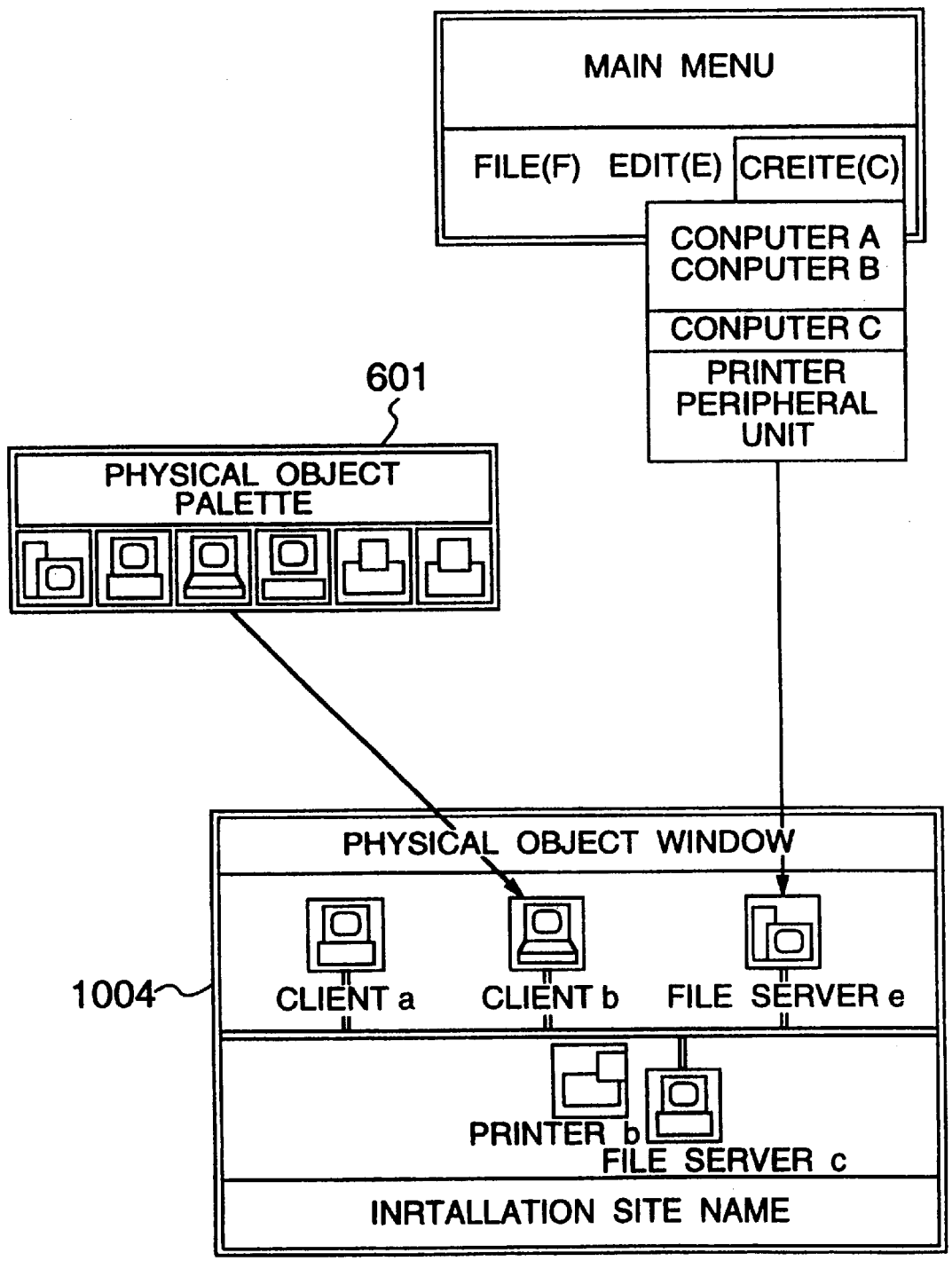
FIG. 10 is a diagram showing a procedure of designing physical parameters in a physical object window according to the embodiment of the present invention.

In the container tree window, when a container corresponding to a hierarchic unit (a section in this embodiment) for which LANs associated with physical object windows to be created are set is clicked two times by the mouse, the container tree module 122 displays a dialog inquiring whether or not either one of the physical object windows beforehand created for the twice-clicked container is to be displayed. Thereafter, according to an indication specified in response to the inquiry, the container tree module 122 displays a physical object window 1106 and then sets the window to an active state. If there is missing any physical object window beforehand created, the module 122 generates and displays a new physical object window and then sets the window to an active state. Moreover, as shown in FIG. 10, the module 122 also displays a window 601 called a palette which presents icons of LAN physical units including a computer, a printer, and a peripheral device.

Figure 11:
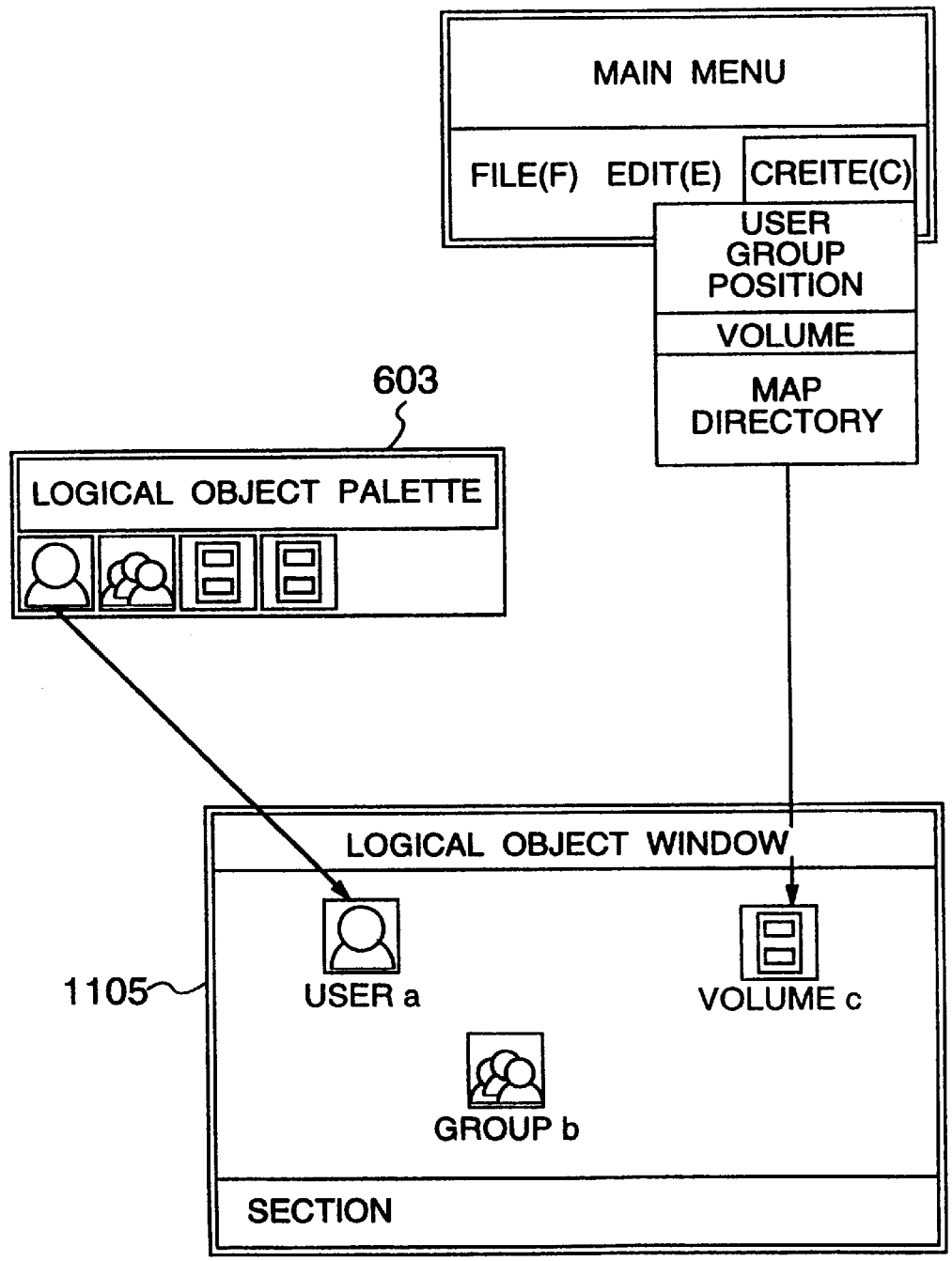
FIG. 11 is a diagram showing a procedure of designing logical parameters in a physical object window according to the embodiment of the present invention.

Similarly, in the container tree window, when a container corresponding to a hierarchic unit associated with a logical object window to be generated is clicked twice, the container tree module 122 produces and displays a logical object window 1105 and then sets the window to an active state. When there exists a logical object window associated with the container clicked twice by the mouse, the module 122 displays the window and sets the window to an active state. Additionally, as shown in FIG. 11, the module 122 also displays a window 602 called a palette presenting icons of LAN physical units including a user, a user group, and a volume.

For the processes related to design of physical parameter using physical object windows, the physical object module 123 is responsible; whereas, for the processes related to design of logical parameter using logical object windows, the logical object module 124 is responsible.

The design of physical parameter using physical object windows can be accomplished in a manner similar to that of the technology described in the JP-A-6-110663 described above. Specifically, for example, using "create" of the main menu, icons of information apparatuses constituting the associated LAN are called to be moved from the menus of computers, printers, peripheral devices to the physical object window. Alternatively, icons of information apparatuses to be called via a palette are dragged into the physical object window, thereby moving the icons to the physical object window. The icons of the respective information apparatuses thus called to the physical object window are displayed in the format in which these icons are connected to cables prepared when the window is created by the physical object module as shown in FIG. 10. In this connection, these information apparatuses and cables are called physical objects.

Next, assigned to computers are such attributes as clients, file servers, printer servers, and workstations.

The assignment of the attributes is carried out as follows. An icon of the computer to which attributes are to be assigned is clicked twice to cause the physical object module to display a menu such that the attributes to be assigned are selected from the menu. The selection is accomplished according to the role of the computer in the LAN. Incidentally, a printer is assumed to fixedly have an attribute of printer and a cable is assume to fixedly possess an attribute of cable.

Subsequently, physical parameters are set for the respective information apparatuses. This is achieved as follows. Icons corresponding to the objective information apparatuses are specified by the mouse. In the main menu, a menu item corresponding to an attribute to be set for the information apparatus under the setup operation is specified. In a dialog displayed in response to the specification, physical parameters of the information apparatus are set in association with an icon specified by the mouse.

As physical parameters, an address in the pertinent LAN, a communication protocol employed in the LAN, and the like are set for a cable; whereas, for each of the other information apparatuses, there are set a title thereof, an address thereof in the LAN, and information specifying internal physical and logical configurations thereof.

In this regard, in the physical object module 123, the computer and printer palette module 1231 are responsible for the process related to the palette 601, the respective setting modules 1232 to 1236 are responsible for the acceptance of setting of physical parameters to the respective physical objects, and the physical object window module are responsible for the other processes.

As a result of the operations above, there are specified physical parameters of the LAN.

The design of logical parameters via the logical object window is also achieved in a similar fashion.

Concretely, for example, employing the user, user group, and volume menus selected from "create" of the main menu, icons of logical components and elements (logical objects) in the hierarchic unit of the associated container are first called to the logical object window as shown in FIG. 11. Or, the desired icons of logical components and elements are dragged from the palette 602 to the physical object window, thereby calling the icons to the logical object window.

In the operation, for an icon of a volume, when a computer having an attribute of a file server is created in a physical object window corresponding to the same container, a logical object module to which the condition above is notified from the physical object module is automatically generated.

Next, logical parameters are set for the respective logical components and elements. This is achieved as follows. Specifying an icon corresponding to an objective logical component or element, a menu associated with the logical component or element under the setup operation is designated in the main menu. In a dialog presented in response to the specification, logical parameters are set for the logical component or element corresponding to the icon specified by the mouse.

Figure 12:
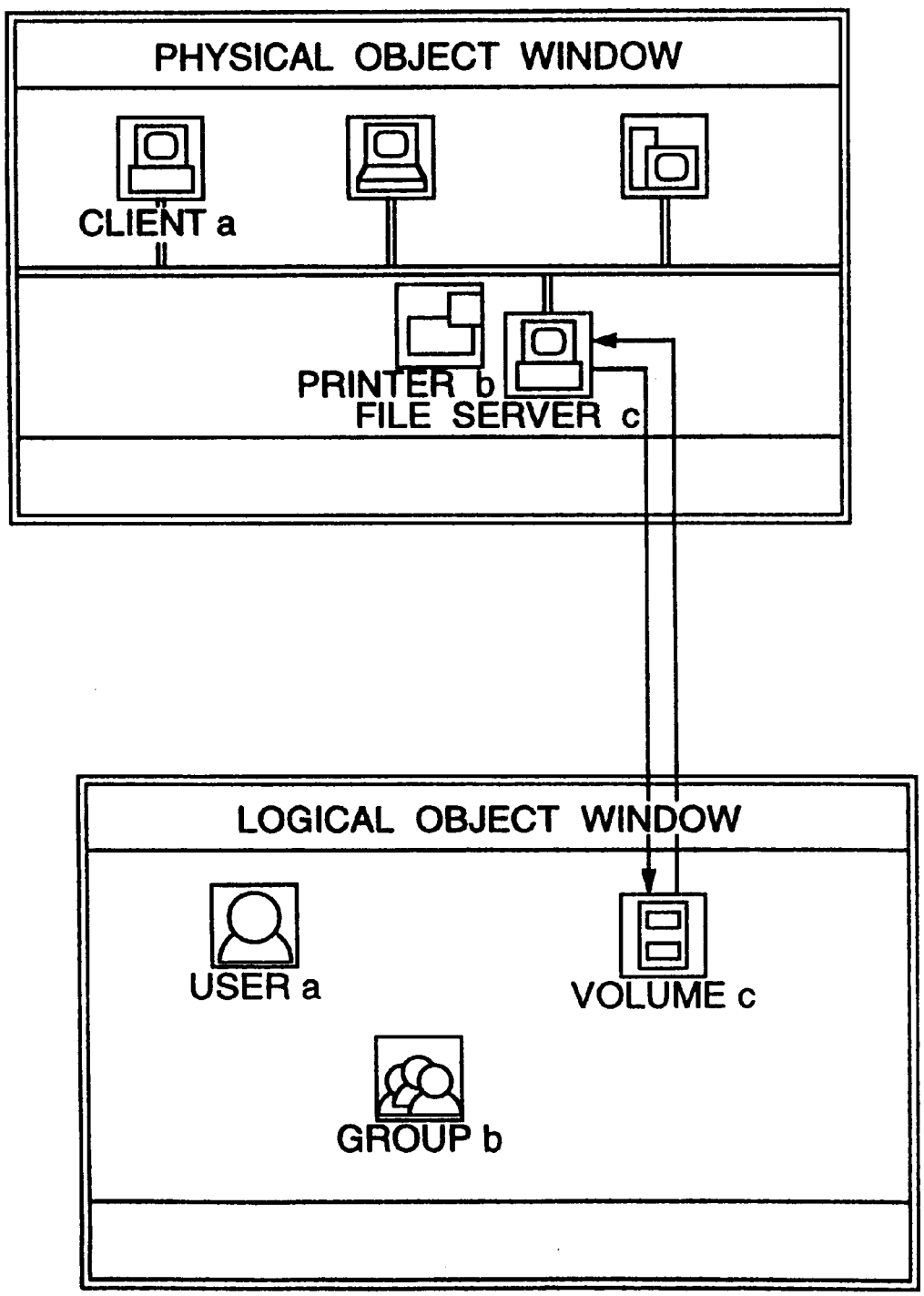
FIG. 12 is a diagram showing an example of establishing relationships between a physical object and a logical object according to the embodiment of the present invention.

The logical parameters are set, for example, as follows. For a user, there are set a title thereof, a password, authority, and names of information apparatuses such as computers to be related to the user. For a user group, a title thereof and authority are specified. For a volume, there is designated a name or the like of a physical constituent element used as the volume, for example, a file server. However, for a volume automatically created by the logical object module, there is automatically set, for example, the name of the file server having caused the creation of the volume. FIG. 12 shows this relationship. As can be seen from this diagram, when a setting state of logical parameters of the volume, for example, a file server name is altered on the logical object window side, the physical object module receiving the pertinent notification from the logical object module in a manner converse to that described above changes the associated file server name. When specifying a constituent user of a user group, an icon of the user is dragged by the mouse to be dropped onto an icon of the user group in the logical object window. The logical object module registers, as a constituent user of the user group, the user corresponding to the icon dropped onto the user group.

In this connection, in the logical object module 124, the logical object palette module 1241 is responsible for the processes related to palettes, the reception of setting of respective logical objects is carried out by the setting modules 1243 to 1246, and the logical object window module the other processes.

Next, like information of the container tree described above, the physical and logical parameters thus designed are stored in the memory respectively by the physical and logical object modules at appropriate points of time.

Figure 13:
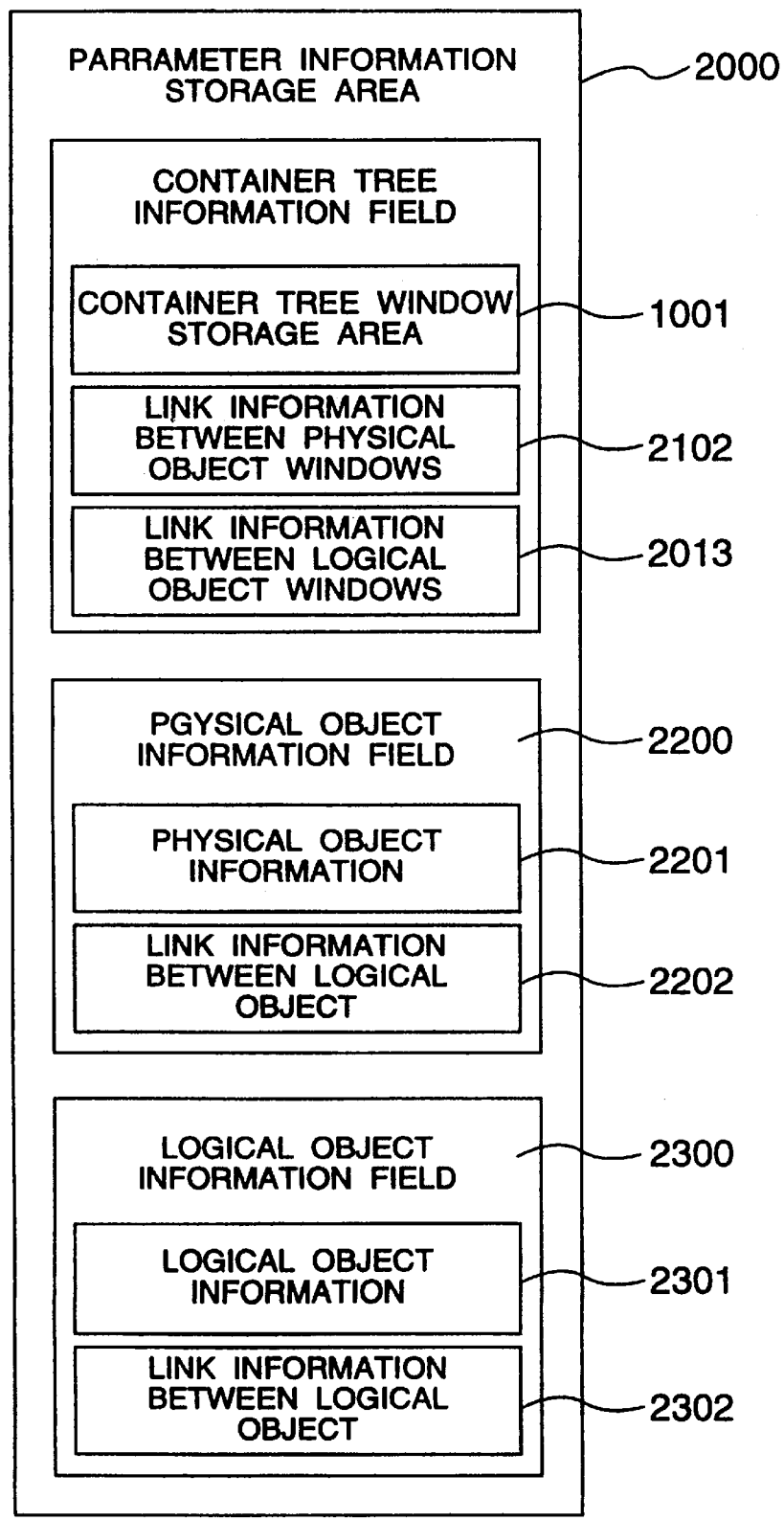
FIG. 13 is a diagram showing a layout of a parameter information storage area according to the embodiment of the present invention.

That is, as shown in FIG. 13, a parameter information storage area 2000 is provided in the memory. The area 200 includes a container tree information field 2100, a physical object information field 2200, and a logical object information field 2300. Moreover, the container tree information field 2100 includes the container tree window storage area 1001, a physical object window link area 2102 in which correspondences between containers and physical object windows are described, and a logical object window link area 2103 in which correspondences between containers and logical object windows are described. When a logical or physical object window is generated in association with a container as described above, information denoting a correspondence between the container and the generated logical or physical object window is described in the physical or logical object window link area 2102 or 2103. Using the information, each module can recognize correspondences between the physical and logical object windows.

Additionally, the physical object information field 2200 includes physical object information 2201 indicating attributes and physical parameters set for the respective physical objects and logical object link information 2202 designating relationships between the physical and logical objects, information 2201 and 2202 being described by the physical object module. In the logical object link information 2202, the above correspondences between file servers and volumes, relationships between users and physical objects, and the like are described by the physical object module in cooperation with the logical object module.

Furthermore, the logical object information field 2300 includes logical object information 2301 indicating attributes and logical parameters set for the respective logical objects and physical object link information 2302 denoting relationships between the physical and logical objects, the logical object information 2301 and physical object link information 2302 having been written by the logical object module. In the physical object link information 2302, the above correspondences between file servers and volumes, relationships between users and physical objects, and the like are described by the logical object module in cooperation with the physical object module.

After the design of the logical hierarchic structure of the network and physical and logical parameters is thus completed, when the save menu of "file" of the main menu is selected together with a file name and a save destination in the container tree window, the main menu module instructs a parameter control module to save the parameter information storage area 2000.

On receiving the indication, a parameter information save module of the parameter control module saves information of the parameter information storage area 2000 as a parameter file in an appropriate format, the file having a file name specified for a storage media (a floppy disk, a hard disk, or the like) 108 of an external storage designated as the save destination.

Moreover, after the design of the logical hierarchic structure of the network and physical and logical parameters is finished, when a portion of the container tree is specified by the mouse and an export menu of "file" of the main menu is selected in the container tree window together a file name and a save destination, the main menu module instructs the parameter control module to achieve "export" of the parameter information storage area 2000.

When the indication is received, the parameter information save module 125 of the parameter control module 124 accesses information of the parameter information storage area 2000 to save a portion thereof corresponding to hierarchy of the area specified by the mouse as a parameter file in an appropriate format, the file having a file name specified for a storage media (a floppy disk, a hard disk, or the like) 108 of the external storage designated as the save destination.

The parameter files thus saved on a floppy disk or the like are thereafter used to set the actual information apparatuses constituting the network.

Figure 14:
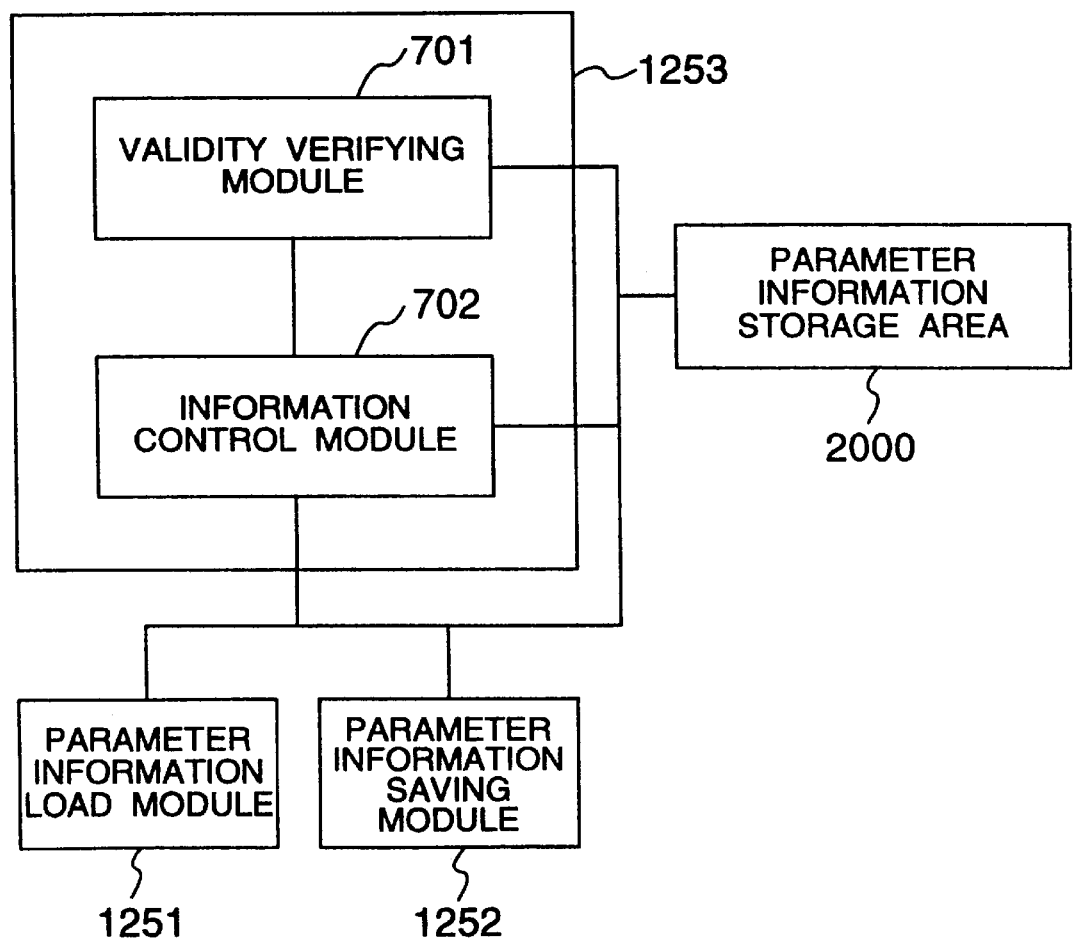
FIG. 14 is a block diagram showing the configuration of an information control module according to the embodiment of the present invention.

In this regard, the parameter information control module 1253 of the parameter control module includes a validity verifying module 701 and an information control module 702 as shown in FIG. 14. The module 702 controls information of the parameter information storage area 2000 through the operations to design the logical hierarchic structure of the network and physical and logical parameters and the operation to save the parameter files. Each time information of the logical hierarchic structure of the network and physical and logical parameters is written in the area 2000 or in response to an indication of verification of information, the validity verifying module 701 verifies completeness and integrity thereof. If the completeness or integrity is not observed, the module 701 notifies a warning message, for example, by presenting the condition on the display unit. The contents of verification relates to duplication between the titles of the containers and physical and logical objects, duplication between the addresses of the physical objects, and integrity of communication protocols. For example, a warning message is issued in case where an identical intra-LAN address is set in a duplicate fashion for information apparatuses in the same LAN.

Using the design support unit 100, the designer is now able to re-read and re-edit the parameter files thus stored in the external storage 108 and merge the files with another container tree under an editing operation.

In other words, when the loading of the file menu of the main menu described above is specified together with the name of a parameter file to be loaded, the parameter information load module 1251 receiving the pertinent indication from the main menu module 121 reads the specified parameter file from the external storage 108, reserves in the memory 102 the parameter information storage area 2000 for the parameter file, and then develops the contents of the parameter file in the reserved parameter information storage area 2000. When the contents of the parameter file are developed in the reserved area 2000, the container tree module generates and displays a container tree window 1101 in which a container tree indicated by the contents is presented, and sets the window 1101 to an active state.

Thereafter, an edit operation can be accomplished as described above.

Furthermore, while a container tree is being edited in a container tree window, when a merge operation of the file menu of the main menu is specified together with a name of a parameter file to be merged, the parameter information load module 1251 receiving the pertinent indication from the main menu module reads the specified parameter file from the external storage, reserves in the memory a merge parameter information storage area, and develops the contents of the parameter file in the reserved area. When the contents of the parameter file are developed in the reserved area, the container tree module generates and displays a container tree window 1101 for a container tree indicated by the contents, and sets the window 1101 to an active state.

Figure 15:
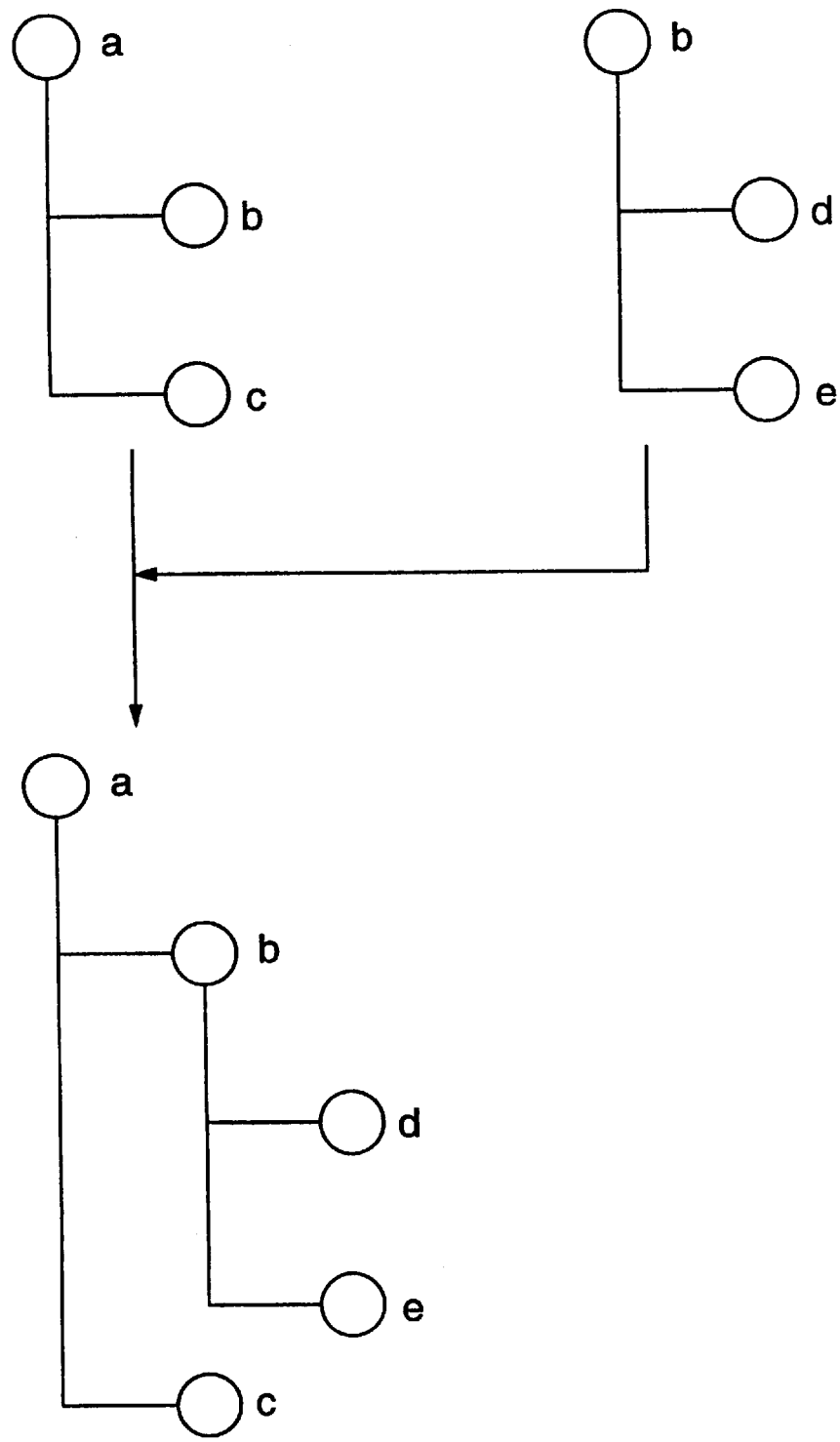
FIG. 15 is a diagram showing a merging process conducted by the design support apparatus according to the embodiment of the present invention.

As a result of the operations above, two container tree windows have been presented on the display. The designer selects the all or a portion of the container tree displayed in the container tree window for the merging operation and then drags the selected item and drops the item onto the container tree window under the editing operation. The container tree module then merges the dropped container tree with the container tree in the container tree window under the editing operation as shown in FIG. 15.

In short, the container tree module retrieves from the dropped container tree container B having a title matching that of container A in the container tree under the editing operation and then incorporates container B in the container tree under the editing operation such that trees linked with the retrieved container B are coupled with container A in the container tree under the editing operation like in the dropped container tree, thereby displaying the resultant image. However, when there is missing in the container tree under the editing operation a container having a title equal to that of one of the containers in the dropped container tree, the dropped container is incorporated into the container tree under the editing operation such that the upper-most container position of the dropped container tree is at an arbitrary position in the container tree under the editing operation (e.g., at a son-container position of the upper-most container thereof).

Incidentally, in the incorporating operation above, the physical and logical object windows corresponding to the containers in the incorporated container tree are also incorporated into the container tree together with the container tree. The container tree module updates information of the parameter information storage area 2000 to retain integrity of the information related to the incorporating operation.

According to the merging process described above, it is possible to implement a design environment as follows.

For example, the designer of the overall network generates as a container tree only logical hierarchic structure of such items at an upper hierarchy as firms, offices, and divisions. On the other hand, the designer belonging to each division generates logical hierarchic structure of the division and sections and physical and logical parameters of the respective sections and stores these items in parameter files as described above and then sends the files to the designer of the overall network. The designer of the overall network merges the parameter files transmitted from the respective divisions with the container tree having the upper hierarchy to complete a parameter file of the overall network.

Additionally, according to the export process of "file" of the main menu described above, there can be implemented a design environment as follows.

That is, for example, the designer of the overall network generates as a container tree only logical hierarchic structure of such items at an upper hierarchy as firms, offices, and divisions. According to the container tree, the designer creates a plurality of parameter files related to a plurality of containers corresponding to the respective divisions through the export process described above. In addition, the designer produces a parameter file for the overall container tree defining logical hierarchic structure of firms, offices, and divisions through the "save" process. The designer then installs the parameter file created by the "save" process in a data base disposed in predetermined file servers in the network to achieve the overall control operation.

On the other hand, the designer belonging to each division receives a floppy disk storing therein a parameter file which is generated by the designer of the overall network through the export process and which is related to containers corresponding to the division to which the designer belongs. The designer loads the floppy disk through the load process described above to obtain a container tree including only the containers corresponding to the division to which the designer belongs. The designer then edits the container tree to design a container tree additionally including as son containers the containers corresponding to sections belonging to the division. Moreover, the designer designs physical and logical parameters of each section in association with the containers corresponding to the section included in the container tree. Thereafter, the designer creates a parameter file related to the container tree through the "save" process. The designer installs a floppy disk storing therein the created parameter file in each information apparatus of the division to install the parameter file by the installing section 200 of the information apparatus. As a result, the logical hierarchic structure of the division and sections is installed in the data base for the file server in the division, which will be described later.

In this situation, when a predetermined indication is issued from a file server of the division, information of logical hierarchic structure installed in the data base is sent by the installing section of the file server to a predetermined file server having a data base to conduct the overall control operation described above, which will be described later. The predetermined file server sequentially merges the logical hierarchic structure of the division and sections received from the file server of each division with the logical hierarchic structure of firms, offices, and divisions beforehand installed by the designer of the overall network in a manner similar to that used by the merge process described above to generate logical hierarchic structure of the overall network, thereby storing the structure in the data base. On the other hand, the installing section of the predetermined file server also sends in response to an indication information of logical hierarchic structure stored in its data base to the file server of each division. Thanks to this provision, the file server of each division extracts information of logical hierarchic structure of a hierarchic level higher than the hierarchic level thereof to merge information of logical hierarchic structure stored in its data base with the received information of logical hierarchic structure in a fashion similar to that used by the merge process described above, thereby memorizing the resultant information.

Incidentally, since information thus installed in the data bases for the file servers is available for clients and printers in addition to the file servers, the information of logical hierarchic structure is installed only for the file servers in this embodiment.

In the environment above, the procedure for the designer of the overall network to conduct the merging process can be dispensed with.

Next, description will be given of the automatic installation section 200 disposed in each information apparatus of the network to set the contents of the mounted floppy disk to the information apparatus.

Figure 16:
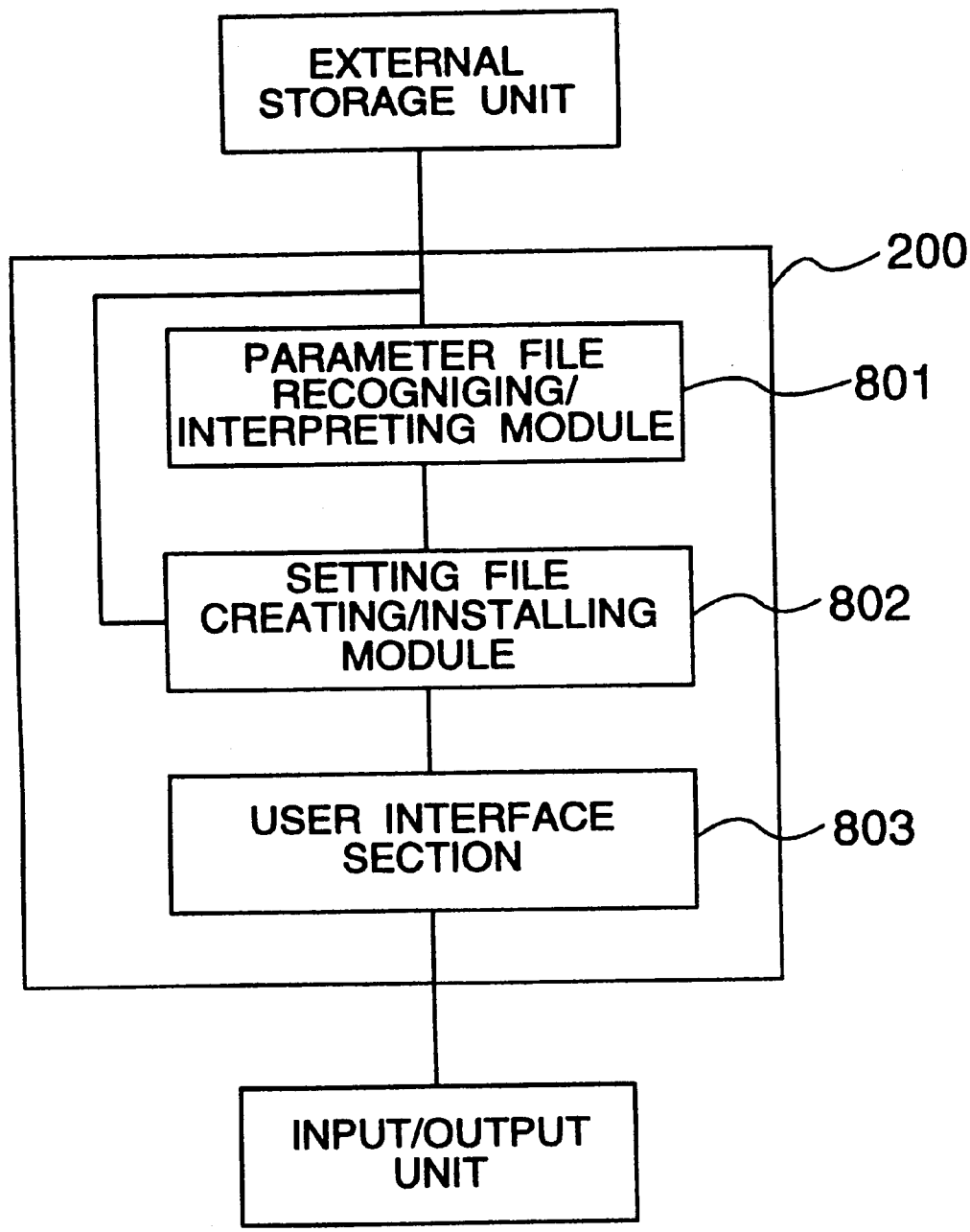
FIG. 16 is a diagram showing the configuration of an installing section according to the embodiment of the present invention.

As shown in FIG. 16, the automatic installation section 200 includes a parameter file recognizing/interpreting module 801, a user interface section 803, and a setting file generating/installing module 802.

The module 802 conducts a read operation for a parameter file, which is created by the design support unit 100 to be then stored on a floppy disk or the like, and analyzes the contents of the file. The user interface section 803 receives information which is contained in the parameter file and which is set to the information apparatus while guiding operations and then sets the information thereto.

In cooperation with the parameter file recognizing/interpreting module 801, the setting file generating/installing module 802 generates according to an indication from the user received by the user interface section a setting file storing therein the contents to be set to the pertinent information apparatus and sets the contents to the information apparatus.

That is, using as a key the title of the information apparatus or the like received by the interface section, the module 802 extracts information to be set to the information apparatus from the parameter file to creates a setting file and then sets the contents to the information apparatus.

For example, for a printer or a computer utilized as a client, the contents to be set thereto are physical parameters of the information apparatus and logical parameters such as users related to the apparatus. Additionally, for a computer employed as a file server, the setting contents are, in addition to the physical parameters of the information apparatus, information of all logical parameters and container trees set in logical object windows corresponding to LANs to which the information apparatus belongs.

Furthermore, the module 802 of the installing section 200 of the file server transmits, in response to an indication received via the user interface section 802, logical information stored in its data base to other file servers specified so as to merge information of logical hierarchic structure received from another file server with information of logical hierarchic structure stored in its data base.

We claim:

1. A network maintenance support system for use with a network including a plurality of information apparatuses in which physical parameter define physical constitution of respective information apparatuses, logical parameters define logical constitution of the network, and logical hierarchic respective structure of the network are set to the respective information apparatuses, comprising:

(a) a design support unit which includes:
      (i) means for supporting design and modification of the logical hierarchic structure of the network,
      (ii) means for supporting the setting of the physical parameters in relation to logical hierarchy of the network thus designed and modified,
      (iii) means for supporting design of the logical parameters in relation to the logical hierarchy of the network thus design and modified,
      (iv) means for storing therein information indicating the designed physical parameters, logical parameters, and logical hierarchic structure, and differential information from a previous parameter file being stored as a differential parameter file, and
      (v) means for reading contents of an existing parameter file from an external storage unit; and
   (b) an installing section disposed in each of the information apparatuses constituting the network, said installing section includes:
      (i) means operative for each of the information apparatuses for extracting from the physical parameters, logical parameters, and logical hierarchic structure indicated by the information of a parameter file the contents to be set to the information apparatus, and
      (ii) means for setting the extracted contents to the information apparatus.

\* \* \* \* \*